(12) United States Patent
Lee

(10) Patent No.: US 9,647,664 B2
(45) Date of Patent: May 9, 2017

(54) OUTPUT DRIVER, SEMICONDUCTOR APPARATUS, SYSTEM, AND COMPUTING SYSTEM USING THE SAME

(71) Applicant: SK hynix Inc., Incheon-si, Gyeonggi-do (KR)

(72) Inventor: Hyun Bae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/845,582

(22) Filed: Sep. 4, 2015

(65) Prior Publication Data
US 2016/0365851 A1    Dec. 15, 2016

(30) Foreign Application Priority Data

Jun. 15, 2015 (KR) .......................... 10-2015-0084163

(51) Int. Cl.
*H03K 19/018* (2006.01)
*H03K 19/0185* (2006.01)

(52) U.S. Cl.
CPC ................ *H03K 19/0185* (2013.01)

(58) Field of Classification Search
CPC ...... H03K 17/10; H03K 17/102; H03K 17/12; H03K 17/122; H03K 17/16; H03K 17/687; H03K 17/6871; H03K 17/64; H03K 3/012

USPC ........................ 327/108, 109, 110, 111, 112
See application file for complete search history.

(56) References Cited

U.S. PATENT DOCUMENTS

| | | | | |
|---|---|---|---|---|
| 5,430,404 A | * | 7/1995 | Campbell | ........ H03K 19/00361 257/E27.11 |
| 2005/0093602 A1 | * | 5/2005 | Hinterscher | ......... H03K 3/3565 327/205 |
| 2013/0314136 A1 | | 11/2013 | Kwon et al. | |

FOREIGN PATENT DOCUMENTS

KR    1020070103907 A    10/2007

* cited by examiner

*Primary Examiner* — John Poos
(74) *Attorney, Agent, or Firm* — William Park & Associates Ltd.

(57) ABSTRACT

A semiconductor apparatus may include an output driver configured to output an internal signal to an external device. The output driver may include a pad coupled to the external device, a pull-up driver coupled to the pad at an end thereof, a first resistance element coupled to the pull-up driver at an end thereof, and configured to receive a first source voltage at the other end thereof, a pull-down driver coupled to the pad at an end thereof, and a second resistance element coupled to the pull-down driver at an end thereof, and configured to receive a first ground voltage at the other end thereof.

25 Claims, 6 Drawing Sheets

OUTPUT DRIVER, SEMICONDUCTOR APPARATUS, SYSTEM, AND COMPUTING SYSTEM USING THE SAME

CROSS-REFERENCES TO RELATED APPLICATION

The present application claims priority under 35 U.S.C. §119(a) to Korean application number 10-2015-0084163, filed on Jun. 15, 2015, in the Korean Intellectual Property Office, which is incorporated herein by reference in its entirety as set forth in full.

BACKGROUND

1. Technical Field

Various embodiments generally relate to a semiconductor apparatus, and more particularly, to an output driver capable of outputting an internal signal of the semiconductor apparatus, and the semiconductor apparatus, system, and computing system using the same.

2. Related Art

Electronic products for personal use, such as a personal computer, a tablet PC, a laptop computer and a smart phone, are constructed by various electronic components. Two different electronic components within the electronic products may communicate at a high speed to process a large amount of data within a short amount of time. Semiconductor apparatuses of the electronic elements may communicate with one another due to input and output drivers included in the semiconductor apparatuses.

The semiconductor apparatuses may be coupled to one another through a signal transmission line such as a bus. The signal transmission line may allow the semiconductor apparatuses to exchange signals with one another. As the performance of semiconductor apparatuses improves, the semiconductor apparatuses may operate at higher speeds with lower power consumption. Accordingly, a level or magnitude of the signal transmitted through the bus decreases. Therefore, an improved output driver is required for generating the signals to be transmitted through the signal transmission line.

SUMMARY

In an embodiment, a semiconductor apparatus may be provided. The semiconductor apparatus may include an output driver configured to output an internal signal to an external device. The output driver may include a pad coupled to the external device, and a pull-up driver coupled to the pad at an end thereof. The output driver may include a first resistance element coupled to the pull-up driver at an end thereof, and may be configured to receive a first source voltage at the other end thereof. The output driver may include a pull-down driver coupled to the pad at an end thereof. The output driver may include a second resistance element coupled to the pull-down driver at an end thereof, and configured to receive a first ground voltage at the other end thereof.

In an embodiment, a semiconductor apparatus may be provided. The semiconductor apparatus may include an internal circuit configured to output an internal signal, and an output driver configured to output an output signal to a pad based on the internal signal. The output driver may include a pull-up driver coupled to the pad at an end thereof. The output driver may include a first resistance element coupled to the pull-up driver at an end thereof, and coupled to a first source voltage at the other end thereof. The output driver may include a pull-down driver coupled to the pad at an end thereof. The output driver may include a second resistance element coupled to the pull-down driver at an end thereof, and coupled to a first ground voltage at the other end thereof.

In an embodiment, a semiconductor apparatus may be provided. The semiconductor apparatus may include an output driver configured to generate an output signal based on an internal signal, and to output the output signal to an external device through a pad. The semiconductor apparatus may include an impedance setting unit configured to set a resistance value of the pad according to first and second calibration codes. The impedance setting unit may include a plurality of first switching portions, each of which is coupled to the pad at an end thereof. The impedance setting unit may include a pull-up resistance element coupled to the plurality of first switching portions at an end thereof, and coupled to a first source voltage at the other end thereof. The impedance setting unit may include a plurality of second switching portions, each of which is coupled to the pad at an end thereof. The impedance setting unit may include a plurality of pull-down resistance elements, each of which is coupled to the plurality of second switching portions at an end thereof, and coupled to a first ground voltage at the other end thereof.

In an embodiment, a semiconductor apparatus may be provided. The semiconductor apparatus may include an output driver configured to output an internal signal to a pad, and an input driver, the output driver and the input driver commonly coupled to the pad. The input driver is deactivated when the internal signal is output to the pad. Upon receiving a signal from the pad, the output driver is deactivated and the pad is not substantially affected by an impedance of the output driver.

DETAILED DESCRIPTION

Hereinafter, a semiconductor apparatus according to various embodiments will be described below with reference to the accompanying drawings through examples of the various embodiments.

Figure 1:
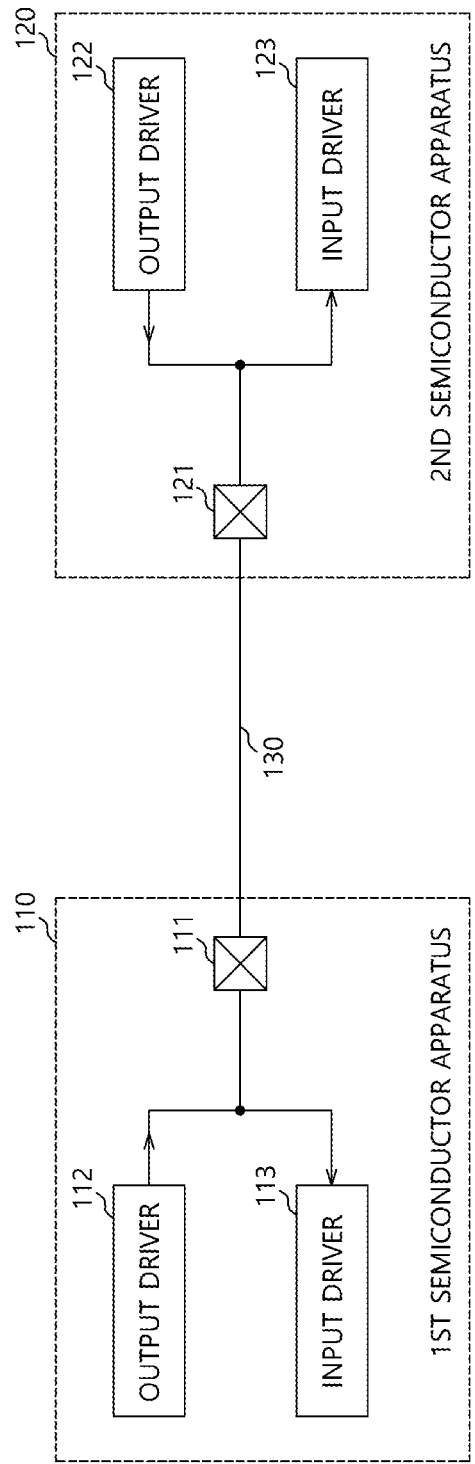
FIG. 1 is a block diagram illustrating a representation of an example of a system in accordance with an embodiment.

Referring to FIG. 1, the system 1 in accordance with an embodiment may include a first semiconductor apparatus 110 and a second semiconductor apparatus 120. The first semiconductor apparatus 110 and the second semiconductor apparatus 120 may communicate with each other. For example, the first semiconductor apparatus 110 may be a master apparatus and the second semiconductor apparatus may be a slave apparatus operable under the control of the first semiconductor apparatus 110. For example, the first semiconductor apparatus 110 may be a host apparatus such as a processor. The processor may include, for example, a central processing unit (CPU), a graphic processing unit (GPU), a multi-media processor (MMP), and a digital signal processor. Also, the first semiconductor apparatus 110 may be implemented in the form of the system on chip through combination of multi-function processor chips such as an application processor (AP). The second semiconductor apparatus 120 may be a memory, and the memory may include a volatile memory and a non-volatile memory. The volatile memory may include, for example but not limited to, a static RAM (SRAM), a dynamic RAM (DRAM), and a synchronous DARM (SDRAM). The non-volatile memory may include a Read Only Memory (ROM), a programmable ROM (PROM), an electrically erase and programmable ROM (EEPROM), an electrically erasable and programmable ROM (EPROM), a flash memory, a phase change RAM (PRAM), a magnetic RAM (MRAM), a resistive RAM (RRAM), and a ferroelectric RAM (FRAM).

The first and second semiconductor apparatuses 110 and 120 may be coupled to each other through a signal transmission line 130. The first semiconductor apparatus 110 may include a pad 111, and the pad 111 may be coupled to the signal transmission line 130. The second semiconductor apparatus 120 may include a pad 121, and the pad 121 may be coupled to the signal transmission line 130. The signal transmission line 130 may be one or more of a channel, a link and a bus. The first semiconductor apparatus 110 may include an output driver 112 and an input driver 113. The output driver 112 may generate an output signal according to an internal signal of the first semiconductor apparatus 110, and may transmit the output signal to the second semiconductor apparatus 120 through the signal transmission line 130. The input driver 113 may generate an internal signal by receiving a signal transmitted from the second semiconductor apparatus 120 through the signal transmission line 130. Similarly, the second semiconductor apparatus 120 may include an output driver 122 and an input driver 123. The output driver 122 may generate an output signal according to an internal signal of the second semiconductor apparatus 120, and may transmit the output signal to the first semiconductor apparatus 110 through the signal transmission line 130. The input driver 123 may generate an internal signal by receiving a signal transmitted from the first semiconductor apparatus 110 through the signal transmission line 130.

Figure 2:
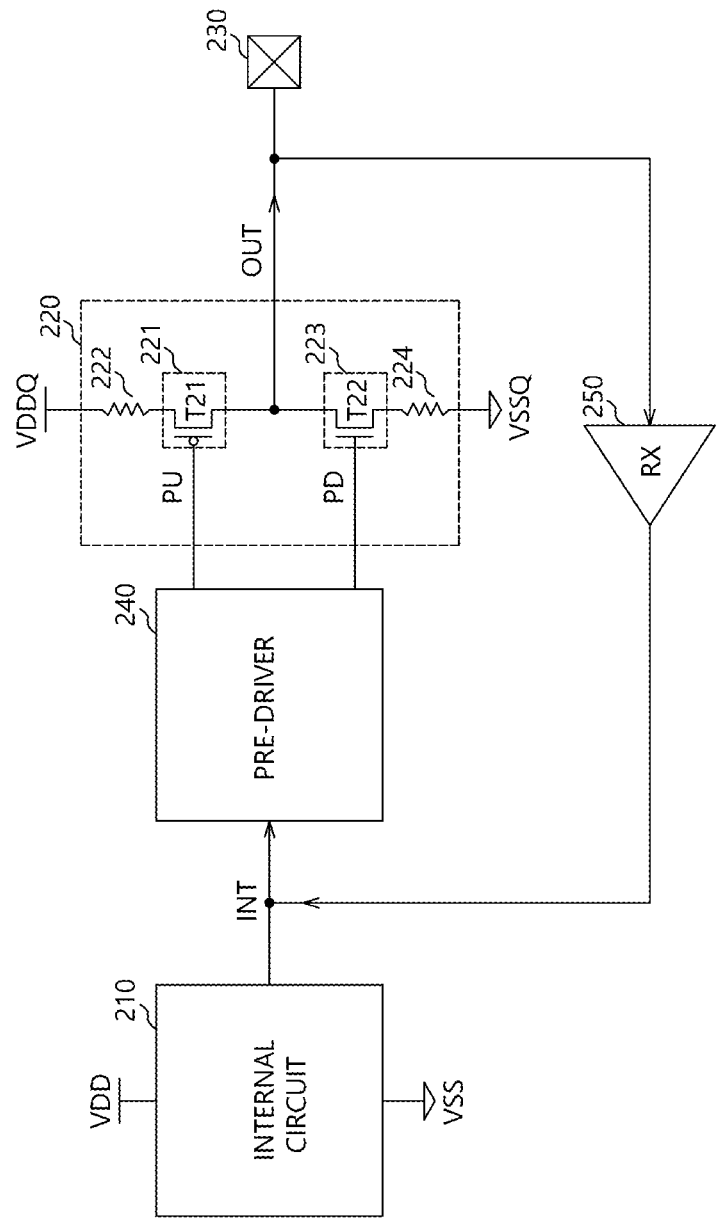
FIG. 2 is a circuit diagram illustrating a representation of an example of a semiconductor apparatus in accordance with an embodiment.

FIG. 2 is a circuit diagram illustrating a representation of an example of a semiconductor apparatus 2 in accordance with an embodiment. Referring to FIG. 2, the semiconductor apparatus 2 may be either the first semiconductor apparatus 110 or the second semiconductor apparatus 120. The semiconductor apparatus 2 may include an internal circuit 210 and an output driver 220. The internal circuit 210 may output an internal signal INT of the semiconductor apparatus 2 to the output driver 220, and may receive a signal from a pad 230. For example, when the semiconductor apparatus 2 is a memory, the internal circuit 210 may include both a core region and a peripheral region. The core region may include a memory cell array disposed therein. The peripheral region may control data input/output operations. The output driver 220 may be coupled to the internal circuit 210 and the pad 230. The pad 230 may be coupled to a signal transmission line coupled to an external apparatus. The output driver 220 may generate an output signal OUT based on the internal signal INT. The output driver 220 may improve accuracy of the output signal OUT to be transmitted through the signal transmission line by efficiently reducing capacitance or loading of the pad 230.

Referring to FIG. 2, the output driver 220 may include a pull-up driver 221, a first resistive element 222, a pull-down driver 223, and a second resistive element 224. The pull-up driver 221 may be coupled to the pad 230 at an end thereof. The pull-up driver 221 may be turned on according to the internal signal INT. The first resistive element 222 may be coupled to the pull-up driver 221 at an end, and may be coupled to a first source voltage VDDQ at the other end. The first resistive element 222 may be a passive resistive element. The pull-down driver 223 may be coupled to the pad 230 at an end thereof. The pull-down driver 223 may be turned on according to the internal signal INT. The second resistive element 224 may be coupled to the pull-down driver 223 at an end, and may be coupled to a first ground voltage VSSQ at the other end. The first source voltage VDDQ and the first ground voltage VSSQ may be source voltages dedicated to the output driver 220. The output driver 220 may output a signal to an external apparatus through the pad 230, and therefore the output driver 220 may drive the pad 230 and the signal transmission line through a noise-minimized source voltage. The internal circuit 210 may be operable by a second source voltage VDD and a second ground voltage VSS. The first source voltage VDDQ and the second source voltage VDD may be inputted through separated source pads, and the first ground voltage VSSQ and the second ground voltage VSS may also be coupled through separated source pads.

Referring to FIG. 2, the semiconductor apparatus 2 may further include a pre-driver 240. The pre-driver 240 may be coupled between the internal circuit 210 and the output driver 220. The pre-driver 240 may generate a pull-up signal PU and a pull-down signal PD based on the internal signal INT. The output driver 220 may generate the output signal OUT in response to the pull-up signal PU and the pull-down signal PD, which are generated on the basis of the internal signal INT. The pre-driver 240 may improve performance of the output driver 220, and may adjust a slew rate of the output signal OUT.

Referring to FIG. 2, the pull-up driver 221 may include a first transistor T21. The first transistor T21 may be the PMOS transistor. A gate of the first transistor T21 may be configured to receive the pull-up signal. A source of the first transistor T21 may be coupled to the first resistive element 222. A drain of the first transistor T21 may be coupled to the pad 230. The pull-down driver 223 may include a second transistor T22. The second transistor T22 may be the NMOS transistor. A gate of the second transistor T22 may be configured to receive the pull-down signal PD. A source of the second transistor T22 may be coupled to the second resistive element 224. A drain of the second transistor T22 may be coupled to the pad 230. When the pull-up signal PU is enabled, the pull-up driver 221 may be turned on and the pad 230 may be driven to the level of the first source voltage VDDQ. Therefore, the output signal OUT of a high level may be transmitted through the pad 230. When the pull-down signal PD is enabled, the pull-down driver 223 may be turned on and the pad 230 may be driven to the level of the first ground voltage VSSQ. Therefore, the output signal OUT of a low level may be transmitted through the pad 230. The pad 230 may be coupled to the first resistive element 222 and the second resistive element 224 through the pull-up driver 221 and the pull-down driver 223, respectively. When the pull-up driver 221 and the pull-down driver 223 are turned off, the pad 230 may not be affected by the impedance of the first resistive element 222 and the second resistive element 224. Therefore, the capacitance of the loading of the pad 230 may be minimized, and a signal generated from the output driver 220 may be precisely transmitted.

Referring to FIG. 2, the semiconductor apparatus 2 may further include an input driver 250. The input driver 250 may be coupled to the pad 230. The output driver 220 and the input driver 250 may be commonly coupled to the pad 230. The input driver 250 may be deactivated when the semiconductor apparatus 2 outputs the internal signal INT to an external apparatus, and the output driver 220 may be deactivated when the semiconductor apparatus 2 receives a signal from an external apparatus. When the output driver 220 is deactivated, the pull-up driver 221 and the pull-down driver 223 may be turned off and the pad 230 may not be affected by the impedance or the loading of the output driver 220. Therefore, the input driver 250 may precisely receive (i.e., RX) a signal transmitted from an external apparatus.

Figure 3:
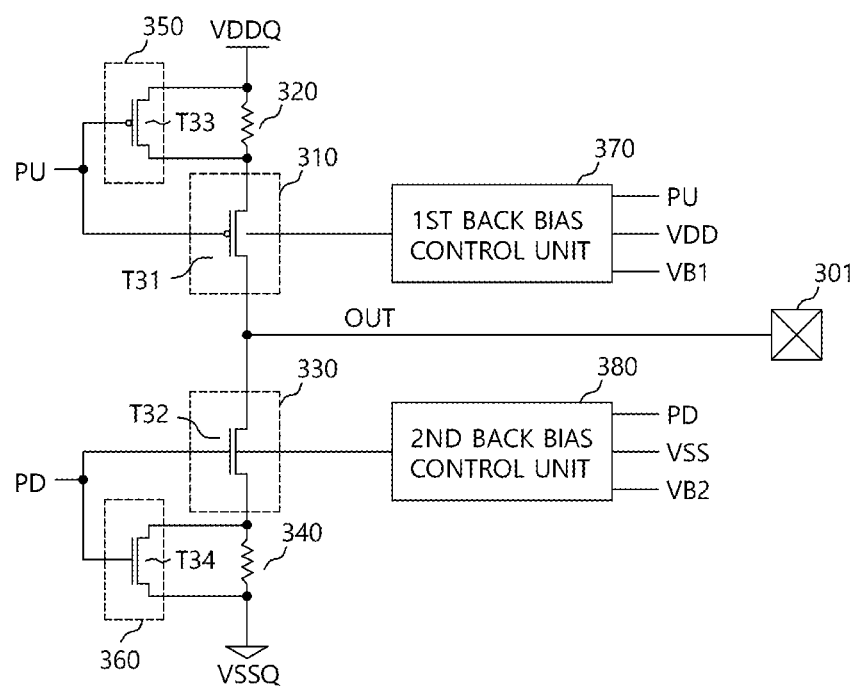
FIG. 3 is a circuit diagram illustrating a representation of an example of an output driver in accordance with an embodiment.

FIG. 3 is a circuit diagram illustrating a representation of an example of an output driver 3 in accordance with an embodiment. The output driver 3 of FIG. 3 may replace the output driver 220 described with reference to FIG. 2. The output driver 3 may drive the pad 301 to one of a high level and a low level in response to the pull-up signal PU, and may output the output signal OUT to an external apparatus through the pad 301. The pad 301 may be coupled to a signal transmission line coupled to an external apparatus. The output driver 3 may include a pull-up driver 310, a first resistive element 320, a pull-down driver 330, and a second resistive element 340.

The output driver 3 may further include a first equalizing unit 350 and a second equalizing unit 360. The first equalizing unit 350 and the second equalizing unit 360 may serve as feed forward equalizers. The first equalizing unit 350 may be coupled to both ends of the first resistive element 320. The first equalizing unit 350 may couple the first source voltage VDDQ to the pull-up driver 310 in response to the pull-up signal PU. When turned on in response to the pull-up signal PU, the first equalizing unit 350 may couple the first source voltage VDDQ to the pull-up driver 310. The second equalizing unit 360 may be coupled to both ends of the second resistive element 340. The second equalizing unit 360 may couple the first ground voltage VSSQ to the pull-down driver 330 in response to the pull-down signal PD. When turned on in response to the pull-down signal PD, the second equalizing unit 360 may couple the first ground voltage VSSQ to the pull-down driver 330.

The pull-up driver 310 and the pull-down driver 330 of the output driver 3 may be coupled to the first source voltage VDDQ and the first ground voltage VSSQ through resistance, respectively, so that the impedance or the loading affecting the pad 301 is reduced. Therefore, when the pull-up driver 310 and the pull-down driver 330 are turned on, the drivability of the pull-up driver 310 and the pull-down driver 330 for driving the pad 301 may be reduced. That is, the pull-up driver 310 may receive the first source voltage VDDQ, which drops by the first resistive element 320, and the pull-down driver 330 may receive the first ground voltage VSSQ, which rises by the second resistive element 340. When the pull-up driver 310 is turned on and pull-up drives the pad 301, the first equalizing unit 350 may reinforce the drivability of the pull-up driver 310 by coupling the pull-up driver 310 to the first source voltage VDDQ. Similarly, when the pull-down driver 330 is turned on and pull-down drives the pad 301, the second equalizing unit 360 may reinforce the drivability of the pull-down driver 330 by coupling the pull-down driver 330 to the first ground voltage VSSQ.

The pull-up driver 310 may include a first transistor T31. The first transistor T31 may be the PMOS transistor. The pull-down driver 320 may include a second transistor T32. The second transistor T32 may be the NMOS transistor. The first equalizing unit 350 may include a third transistor T33. The third transistor T33 may be a PMOS transistor. A gate of the third transistor T33 may be configured to receive the pull-up signal PU. A source of the third transistor T33 may be coupled to the first source voltage VDDQ. A drain of the third transistor T33 may be coupled to the pull-up driver 310. The second equalizing unit 360 may include a fourth transistor T34. The fourth transistor T34 may be an NMOS transistor. A gate of the fourth transistor T34 may receive the pull-down signal PD. A source of the fourth transistor T34 may be coupled to the first ground voltage VSSQ. A drain of the fourth transistor T34 may be coupled to the pull-down driver 330.

Referring to FIG. 3, the output driver 3 may further include a first back bias control unit 370 and a second back bias control unit 380. The first back bias control unit 370 and the second back bias control unit 380 may improve the drivability of the pull-up driver 310 and the pull-down driver 330 by lowering threshold voltages of the first and second transistors T31 and T32 when the pull-up driver 310 and the pull-down driver 330 are turned on, respectively. The first back bias control unit 370 may provide one of either the second source voltage VDD or a first bias voltage VB1 to a bulk of the first transistor T31 in response to the pull-up signal PU. The first bias voltage VB1 may have a lower level than the second source voltage VDD. The second back bias control unit 380 may provide either the second ground voltage VSS or a second bias voltage VB2 to a bulk of the second transistor T32 in response to the pull-down signal PD. The second bias voltage VB2 may have a level lower than the first bias voltage VB1 and higher than the second ground voltage VSS.

When the pull-up driver 310 is turned off, the first back bias control unit 370 may reduce leakage current of the pull-up driver 310 by providing the second source voltage VDD to the bulk of the first transistor T31. When the pull-up driver 310 is turned on, the first back bias control unit 370 may provide the first bias voltage VB1 to the bulk of the first transistor T31. Accordingly, the threshold voltage of the first transistor T31 may be lowered, and the drivability of the pull-up driver 310 may be improved. When the pull-down driver 330 is turned off, the second back bias control unit 380 may reduce leakage current of the pull-down driver 330 by providing the second ground voltage VSS to the bulk of the second transistor T32. When the pull-down driver 330 is turned on, the second back bias control unit 380 may provide the second bias voltage VB2 to the bulk of the second transistor T32. Accordingly, the threshold voltage of the second transistor T32 may be lowered, and the drivability of the pull-down driver 330 may be improved.

Figure 4:
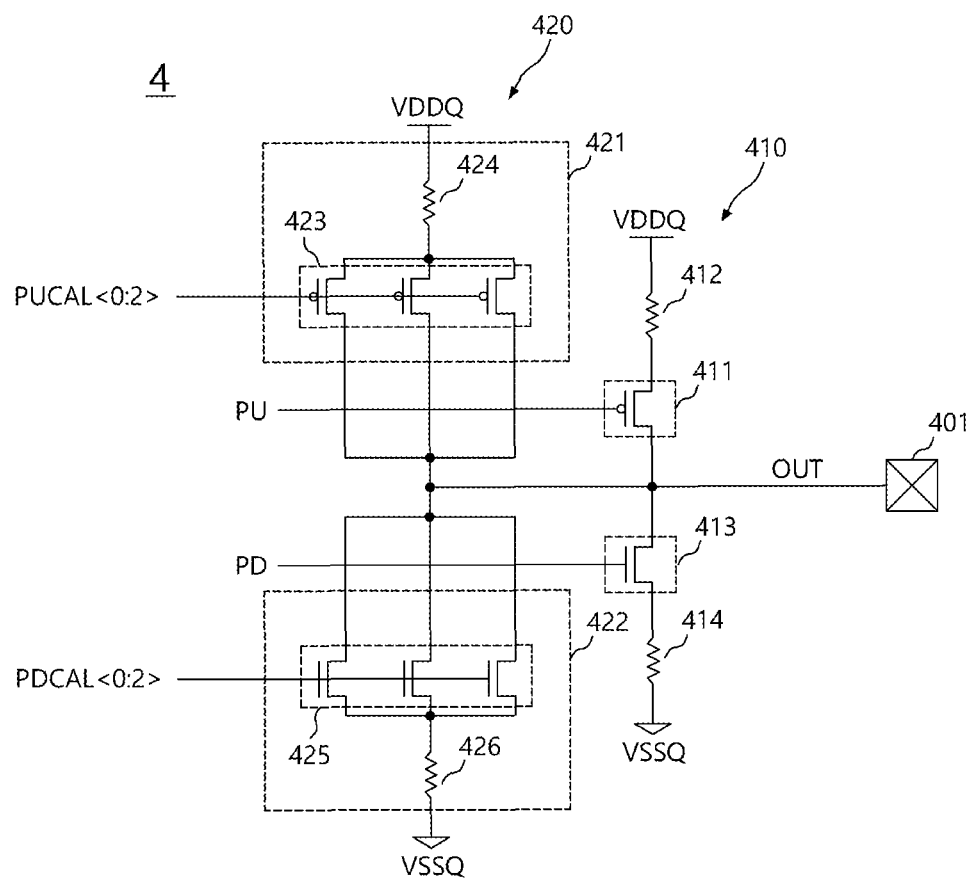
FIG. 4 is a circuit diagram illustrating a representation of an example of a semiconductor apparatus in accordance with an embodiment.

FIG. 4 is a circuit diagram illustrating a representation of an example of a semiconductor apparatus 4 in accordance with an embodiment. The semiconductor apparatus 4 may include an output driver 410 and an impedance setting unit 420. The output driver 410 may drive a pad 401 to one of a high level and low level in response to the pull-up signal PU, and may output the output signal OUT to an external apparatus through the pad 401. The pad 401 may be coupled to a signal transmission line coupled to an external apparatus. The impedance setting unit 420 may set a resistance value of the pad 401 according to an external reference resistance. The impedance setting unit 420 may receive a pull-up calibration signal PUCAL<0:2> and a pull-down calibration signal PDCAL<0:2> through a calibration circuit (not illustrated) included in the semiconductor apparatus 4. The impedance setting unit 420 may include a pull-up resistance setting section 421 and a pull-down resistance setting section 422.

The pull-up resistance setting section 421 may set a pull-up resistance value of the pad 401 in response to the pull-up calibration signal PUCAL<0:2>. The pull-up resistance setting section 421 may include a plurality of first switching portions 423 and a pull-up resistance element 424. Each of the plurality of first switching portions 423 may be coupled to the pad 401 at an end. The plurality of first switching portions 423 may receive the pull-up calibration signal PUCAL<0:2>, respectively. The pull-up resistance element 424 may be coupled to the plurality of first switching portions 423 at an end, and coupled to the first source voltage VDDQ at the other end. The plurality of first switching portions 423 may respectively include PMOS transistors, which have different turn-on resistance values from one another. The pull-up resistance setting section 421 may set the pull-up resistance value of the pad 401 in response to the pull-up calibration signal PUCAL<0:2>. In this way, the impedance setting unit 420 may set a resistance value of the pad 401 according to first and second calibration codes.

The pull-down resistance setting section 422 may set a pull-down resistance value of the pad 401 in response to the pull-down calibration signal PDCAL<0:2>. In this way, the impedance setting unit 420 may set a resistance value of the pad 401 according to first and second calibration codes. The pull-down resistance setting section 422 may include a plurality of second switching portions 425 and a pull-down resistance element 426. Each of the plurality of second switching portions 425 may be coupled to the pad 401 at an end. The plurality of second switching portions 425 may receive the pull-down calibration signal PDCAL<0:2>, respectively. The pull-down resistance element 426 may be coupled to the plurality of second switching portions 425 at an end, and coupled to the first ground voltage VSSQ at the other end. The plurality of second switching portions 425 may respectively include NMOS transistors, which have different turn-on resistance values from one another. The pull-down resistance setting section 422 may set the pull-down resistance value of the pad 401 in response to the pull-down calibration signal PDCAL<0:2>. The impedance setting unit 420 may effectively reduce the impedances or the loadings of the pull-up resistance element 424 and the pull-down resistance element 426, which may affect the pad 401, when the plurality of first switching portions 423 and the second switching portions 425 are turned off.

The output driver 410 may include a pull-up driver 411, a first resistive element 412, a pull-down driver 413, and a second resistive element 414. The output driver 410 may be substantially the same as the output driver 220 described with reference to FIG. 2. Though not illustrated in FIG. 4 the output driver 410 may be coupled to, a second source voltage VDD, a second ground voltage VSS, a pre-driver 240, an internal circuit 210, and input driver 250 substantially the same as the output driver 220 described with reference to FIG. 2. The semiconductor apparatus 4 may be one of either the first semiconductor apparatus 110 or the second semiconductor apparatus 120 as described with reference to FIGS. 1 and 2.

Figure 5:
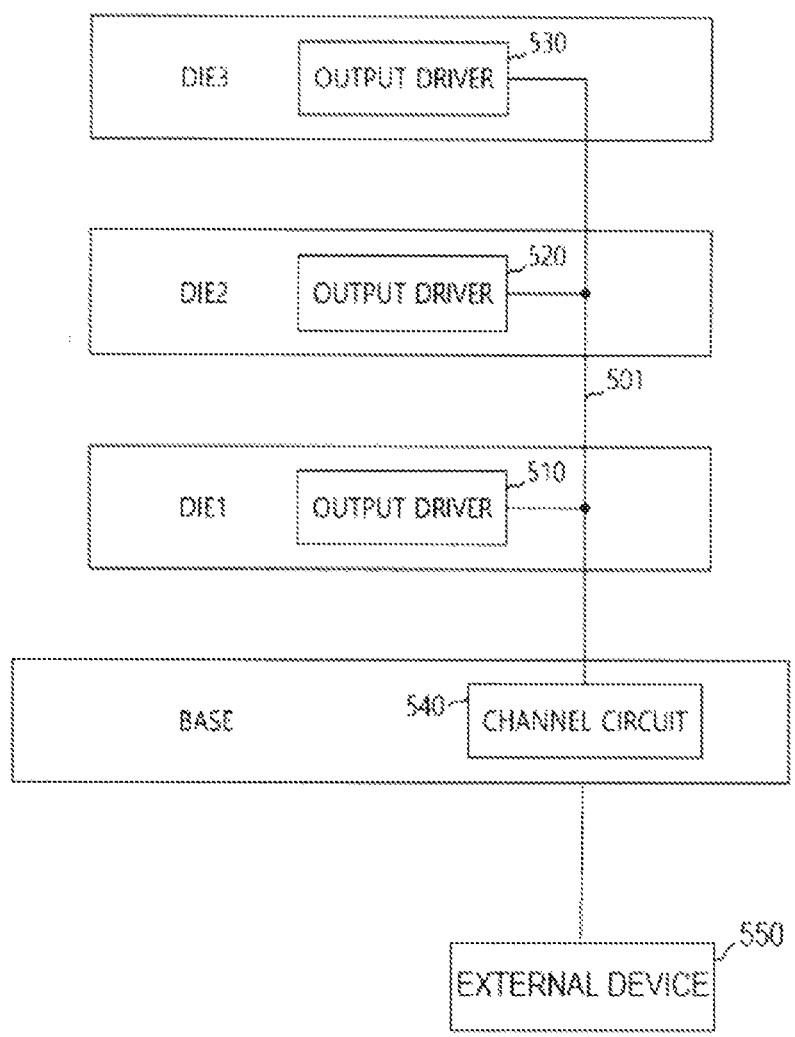
FIG. 5 is a circuit diagram illustrating a representation of an example of a semiconductor apparatus in accordance with an embodiment.

FIG. 5 is a circuit diagram illustrating a representation of an example of a semiconductor apparatus 5 in accordance with an embodiment. Referring to FIG. 5, the semiconductor apparatus 5 may be one of a multi-chip package having a plurality of dies, a stacked semiconductor apparatus, and a 3D semiconductor apparatus. The semiconductor apparatus 5 may include a base die BASE, and a plurality of stacked dies DIE1, DIE2, DIE3. The base die BASE and the plurality of stacked dies DIE1, DIE2, DIE3 may be stacked over one another and packaged into a single package to form a single semiconductor apparatus. The base die BASE may provide the plurality of stacked dies DIE1, DIE2, DIE3 with a signal transmitted from an external device 550, and provide the external device 550 with an output signal from the plurality of stacked dies DIE1, DIE2, DIE3. The base die BASE may function as a logic die or an interposer.

The plurality of stacked dies DIE1, DIE2, DIE3 may share a channel. Each of the plurality of stacked dies DIE1, DIE2, DIE3 may output an internal signal through a common channel 501. One of the plurality of stacked dies DIE1, DIE2, DIE3, which is activated according to a control signal such as a chip selection signal, a rank selection signal, etc., may output a signal through the common channel 501. The other deactivated ones of the plurality of stacked dies DIE1, DIE2, DIE3 may not output a signal through the common channel 501. The plurality of stacked dies DIE1, DIE2, DIE3 may include output drivers 510, 520, 530, respectively. Each of the output drivers 510, 520, 530 may be one of the output drivers 3, 220, 410 described with reference to FIGS. 2 to 4. In the semiconductor apparatus 5, the common channel 501 may be commonly coupled to the output drivers 510, 520, 530 of the plurality of stacked dies DIE1, DIE2, DIE3, and thus may have great capacitance or loading. However, the output drivers 510, 520, 530 in accordance with an example of an embodiment of the present disclosure may minimize the capacitance or the loading of the common channel 501 and make the capacitance or the loading of the common channel 501 minimal. For example, when a first stacked die DIE1 among the plurality of stacked dies DIE1, DIE2, DIE3 is activated, the output driver 510 may be turned on and may output the internal signal of the first stacked die DIE1 to the common channel 501 while the output drivers 520 and 530 of the other deactivated ones DIE2 and DIE3 among the plurality of stacked dies DIE1, DIE2, DIE3 are turned off. At this time, the output signal outputted from the output driver 510 may be precisely transmitted through the common channel 501 since the loading by the resistance elements of the turned-off output drivers 520 and 530 does not affect the common channel 501. The base die BASE may receive the signal transmitted through the common channel 501, and may output the signal to an external device 550. The base die BASE may include a channel circuit 540. The channel circuit 540 may provide the plurality of stacked dies DIE1, DIE2, DIE3 with a signal transmitted from an external device 550, and provide the external device 550 with an output signal from the plurality of stacked dies DIE1, DIE2, DIE3.

Figure 6:
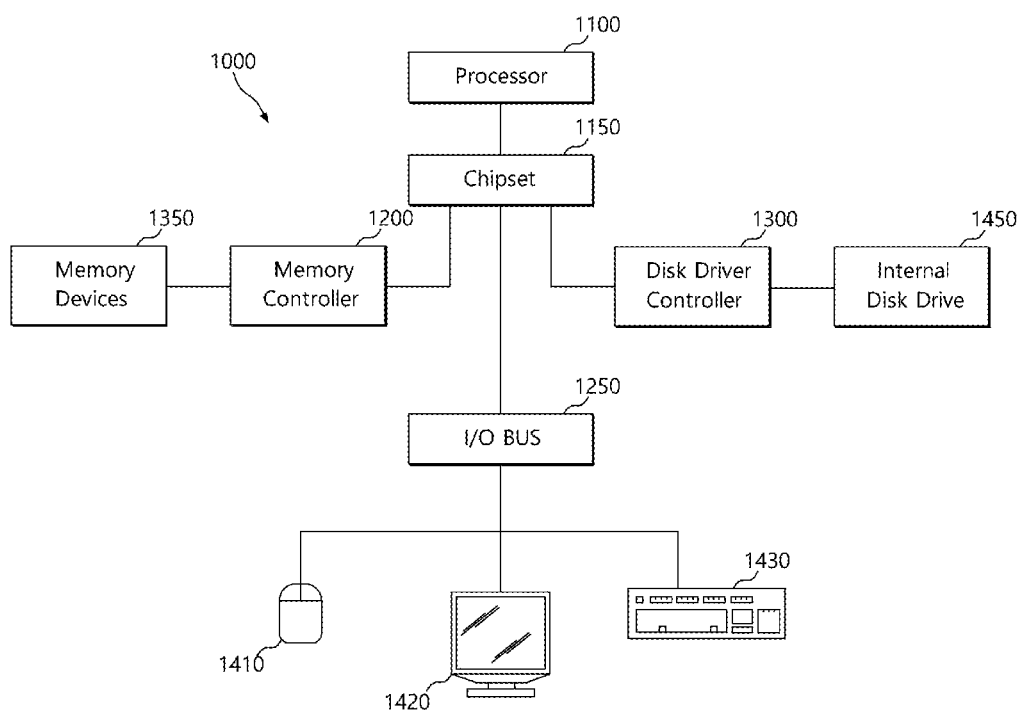
FIG. 6 illustrates a block diagram of an example of a representation of a computing system employing an output driver, semiconductor apparatus, and/or system in accordance with the various embodiments discussed above with relation to FIGS. 1-5.

The output drivers, semiconductor apparatuses, and/or systems discussed above (see FIGS. 1-5) are particular useful in the design of memory devices, processors, and computer systems. For example, referring to FIG. 6, a block diagram of a computing system employing an output driver, semiconductor apparatus, and/or system in accordance with the various embodiments are illustrated and generally designated by a reference numeral 1000. The computing system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a computing system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the computing system 1000. Other components of the computing system 1000 may include a memory controller 1200, an input/output ("I/O") bus 1250, and a disk driver controller 1300. Depending on the configuration of the computing system 1000, any one of a number of different signals may be transmitted through the chipset 1150, and those skilled in the art will appreciate that the routing of the signals throughout the computing system 1000 can be readily adjusted without changing the underlying nature of the computing system 1000.

As stated above, the memory controller 1200 may be operably coupled to the chipset 1150. The memory controller 1200 may include at least one output driver, semiconductor apparatus, and/or system as discussed above with reference to FIGS. 1-5. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one output driver, semiconductor apparatus, and/or system as discussed above with relation to FIGS. 1-5, the memory devices 1350 may include a plurality of word lines and a plurality of bit lines for defining a plurality of memory cells. The memory devices 1350 may be any one of a number of industry standard memory types, including but not limited to, single inline memory modules ("SIMMs"), dual inline memory modules ("DIMMs"), volatile memory, and non-volatile memory (see above). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the computing system 1000 described above in relation to FIG. 6 is merely one example of a computing system 1000 employing an output driver, semiconductor apparatus, and/or system as discussed above with relation to FIGS. 1-5. In alternate embodiments, such as, for example but not limited to, cellular phones or digital cameras, the components may differ from the embodiments illustrated in FIG. 6.

While certain embodiments have been described above, it will be understood to those skilled in the art that the embodiments described are by way of example only. Accordingly, the output driver, semiconductor apparatus, system, and computing system using the same should not be limited based on the described embodiments. Rather, the output driver, semiconductor apparatus, system, and computing system using the same described herein should only be limited in light of the claims that follow when taken in conjunction with the above description and accompanying drawings.

What is claimed is:

1. A semiconductor apparatus comprising:
    an output driver configured to output an internal signal to an external device,
    wherein the output driver comprises:
    a pad configured to couple with the external device;
    a pull-up driver having an end coupled to the pad;
    a first resistance element having an end coupled to the pull-up driver, and having the other end configured to receive a first source voltage;
    a pull-down driver having an end coupled to the pad;
    a second resistance element having an end coupled to the pull-down driver, and having the other end configured to receive a first ground voltage; and
    an input driver coupled to the pad, and configured to receive a signal transmitted from the external device.

2. The semiconductor apparatus of claim 1,
    wherein the pull-up driver comprises a first transistor configured to be turned on based on the internal signal, and
    wherein the pull-down driver comprises a second transistor configured to be turned on based on the internal signal.

3. The semiconductor apparatus of claim 2,
    wherein the output driver further comprises a first back bias control unit configured to provide a first bias voltage to a bulk of the first transistor when the pull-up driver is turned on, and to provide a second source voltage to the bulk of the first transistor when the pull-up driver is turned off, and
    wherein the first bias voltage has a lower level than the second source voltage.

4. The semiconductor apparatus of claim 2,
    wherein the output driver further comprises a second back bias control unit configured to provide a second bias voltage to a bulk of the second transistor when the pull-down driver is turned on, and to provide a second ground voltage to the bulk of the second transistor when the pull-down driver is turned off, and
    wherein the second bias voltage has a higher level than the second ground voltage.

5. The semiconductor apparatus of claim 1, wherein the output driver further comprises:
    a first equalizing unit coupled to both ends of the first resistive element, and configured to couple the first source voltage to the pull-up driver based on the internal signal; and
    a second equalizing unit coupled to both ends of the second resistive element, and configured to couple the first ground voltage to the pull-down driver based on the internal signal.

6. The semiconductor apparatus of claim 1, further comprising a pre-driver configured to receive the internal signal, and to generate a pull-up signal and a pull-down signal for controlling the pull-up driver and the pull-down driver.

7. A semiconductor apparatus comprising:
an internal circuit configured to output an internal signal, wherein the internal circuit is operable by a first source voltage and a first ground voltage; and
an output driver configured to output an output signal to a pad based on the internal signal,
wherein the output driver comprises:
a pull-up driver having an end coupled to the pad;
a first resistance element having an end coupled to the pull-up driver, and having the other end coupled to a second source voltage;
a pull-down driver having an end coupled to the pad; and
a second resistance element having an end coupled to the pull-down driver, and having the other end coupled to a second ground voltage.

8. The semiconductor apparatus of claim 7, further comprising an input driver coupled to the pad, and configured to receive a signal transmitted from the pad.

9. The semiconductor apparatus of claim 7, further comprising a pre-driver configured to generate a pull-up signal and a pull-down signal based on the internal signal.

10. The semiconductor apparatus of claim 9,
wherein the pull-up driver is turned on in response to the pull-up signal, and
wherein the pull-down driver is turned on in response to the pull-down signal.

11. The semiconductor apparatus of claim 10, wherein the output driver further comprises:
a first equalizing unit coupled to both ends of the first resistive element, and configured to couple the second source voltage to the pull-up driver in response to the pull-up signal; and
a second equalizing unit coupled to both ends of the second resistive element, and configured to couple the second ground voltage to the pull-down driver in response to the pull-down signal.

12. A semiconductor apparatus comprising:
an output driver configured to generate an output signal based on an internal signal, and to output the output signal to an external device through a pad; and
an impedance setting unit configured to set a resistance value of the pad according to first and second calibration codes,
wherein the impedance setting unit comprises:
a plurality of first switching portions, each of the first switching portions having an end coupled to the pad;
a pull-up resistance element having an end coupled to the plurality of first switching portions, and having the other end coupled to a first source voltage;
a plurality of second switching portions, each of the second switching portions having an end coupled to the pad; and
a pull-down resistance element having an end coupled to the plurality of second switching portions, and having the other end coupled to a first ground voltage.

13. The semiconductor apparatus of claim 12,
wherein the plurality of first switching portions are turned on in response to a pull-up calibration signal, and
wherein the plurality of second switching portions are turned on in response to a pull-down calibration signal.

14. The semiconductor apparatus of claim 12, wherein turn-on resistance values of the plurality of first switching portions are different from one another.

15. The semiconductor apparatus of claim 12, wherein turn-on resistance values of the plurality of second switching portions are different from one another.

16. The semiconductor apparatus of claim 12, wherein the output driver comprises:
a pull-up driver having an end coupled to the pad;
a first resistance element having an end coupled to the pull-up driver, and having the other end coupled to the first source voltage;
a pull-down driver having an end coupled to the pad; and
a second resistance element having an end coupled to the pull-down driver, and having the other end coupled to the first ground voltage.

17. The semiconductor apparatus of claim 16,
further comprising a pre-driver configured to generate a pull-up signal and a pull-down signal based on the internal signal,
wherein the pull-up driver is turned on in response to the pull-up signal, and
wherein the pull-down driver is turned on in response to the pull-down signal.

18. The semiconductor apparatus of claim 17, wherein the output driver further comprises:
a first equalizing unit coupled to both ends of the first resistive element, and configured to couple the first source voltage to the pull-up driver in response to the pull-up signal; and
a second equalizing unit coupled to both ends of the second resistive element, and configured to couple the first ground voltage to the pull-down driver in response to the pull-down signal.

19. A semiconductor apparatus comprising:
an output driver configured to output an internal signal to a pad; and
an input driver, the output driver and the input driver commonly coupled to the pad,
wherein the input driver is deactivated when the internal signal is output to the pad, and
wherein upon receiving a signal from the pad, the output driver is deactivated and the pad is not substantially affected by an impedance of the output driver
wherein the output driver comprises
a pull-up driver coupled between the pad and a first source voltage;
a pull-down driver coupled between the pad and a first ground voltage;
a first resistive element coupled between the first source voltage and the pull-up driver; and
a second resistive element coupled between the first ground voltage and the pull-down driver.

20. The semiconductor apparatus of claim 19, further comprising:
a pre-driver configured to generate a pull-up signal and a pull-down signal based on the internal signal,
wherein the output driver is configured to generate an output signal in response to the pull-up signal and the pull-down signal, and
wherein the pre-driver is configured to adjust a slew rate of the output signal received by the pad.

21. The semiconductor apparatus of claim 19, wherein the pull-up driver is configured to be turned on based on the internal signal and to drive the pad to a level of the first source voltage to allow an output signal of a high level to be transmitted through the pad, and
wherein the pull-down driver is configured to be turned on based on the internal signal and to drive the pad to a level of the first ground voltage to allow an output signal of a low level to be transmitted through the pad.

22. The semiconductor apparatus of claim 21, wherein the output driver further comprises:
- a first back bias control unit coupled to the pull-up driver and configured to lower a threshold voltage of the pull-up driver when the pull-up driver is turned on; and
- a second back bias control unit coupled to the pull-down driver and configured to lower a threshold voltage of the pull-down driver when the pull-down driver is turned on.

23. The semiconductor apparatus of claim 22,
wherein the first back bias control unit is configured to reduce leakage current of the pull-up driver by providing a second source voltage to the pull-up driver, and
wherein the second back bias control unit is configured to reduce leakage current of the pull-down driver by providing a second ground voltage to the pull-down driver.

24. The semiconductor apparatus of claim 21, wherein the semiconductor apparatus further comprises:
- an impedance setting unit configured to set a resistance value of the pad according to first and second calibration codes.

25. The semiconductor apparatus of claim 24, wherein the impedance setting unit comprises:
- a plurality of first switching portions, each of the first switching portions having an end coupled to the pad;
- a pull-up resistance element having an end coupled to the plurality of first switching portions, and having the other end coupled to the first source voltage;
- a plurality of second switching portions, each of the second switching portions having an end coupled to the pad; and
- a pull-down resistance element having an end coupled to the plurality of second switching portions, and having the other end coupled to the first ground voltage.

* * * * *

UNITED STATES PATENT AND TRADEMARK OFFICE
CERTIFICATE OF CORRECTION

PATENT NO.         : 9,647,664 B2
APPLICATION NO.    : 14/845582
DATED              : May 9, 2017
INVENTOR(S)        : Hyun Bae Lee It is certified that error appears in the above-identified patent and that said Letters Patent is hereby corrected as shown below:

Item (71) Applicant

Change "SK hynix Inc., Incheon-si, Gyeonggi-do (KR)" to --SK hynix Inc., Icheon-si, Gyeonggi-do (KR)--.

Signed and Sealed this
Thirteenth Day of June, 2017

Joseph Matal
*Performing the Functions and Duties of the*
*Under Secretary of Commerce for Intellectual Property and*
*Director of the United States Patent and Trademark Office*